US006188877B1

(12) United States Patent
Boesch et al.

(10) Patent No.: US 6,188,877 B1
(45) Date of Patent: Feb. 13, 2001

(54) DUAL-BAND, DUAL-MODE POWER AMPLIFIER WITH REDUCED POWER LOSS

(75) Inventors: Ronald D. Boesch, Morrisville; Ronald C. Meadows, Youngsville, both of NC (US)

(73) Assignee: Ericsson Inc., Research Triangle Park, NC (US)

( * ) Notice: Under 35 U.S.C. 154(b), the term of this patent shall be extended for 0 days.

(21) Appl. No.: 09/177,233

(22) Filed: Oct. 22, 1998

Related U.S. Application Data (63) Continuation-in-part of application No. 09/094,515, filed on Jun. 10, 1998, which is a continuation-in-part of application No. 08/888,168, filed on Jul. 3, 1997, now Pat. No. 5,969,582, and a continuation-in-part of application No. 08/939,870, filed on Sep. 29, 1997, now Pat. No. 6,091,966.

(51) Int. Cl.$^7$ ....................................................... H04Q 7/32
(52) U.S. Cl. .............................. 455/74; 455/93; 455/553; 455/127
(58) Field of Search ................................. 455/74, 78, 80, 455/93, 124, 127, 552, 553, 426, 114, 117; 375/216; 370/321, 347; 330/124 R, 126, 129; 333/124, 129, 132

(56) References Cited

U.S. PATENT DOCUMENTS

| 2,247,898 | 7/1941 | Wheeler et al. |
|---|---|---|
| 3,332,038 | 7/1967 | Stanley et al. ........................ 333/129 |
| 4,085,405 | 4/1978 | Barlow ................................. 333/129 |
| 5,060,294 | 10/1991 | Schwent et al. ........................ 455/93 |

(List continued on next page.)

FOREIGN PATENT DOCUMENTS

| 2111616 | 6/1994 | (CA) . |
|---|---|---|
| 2120679 | 11/1994 | (CA) . |
| 0 482 502 A2 | 4/1992 | (EP) . |

(List continued on next page.)

OTHER PUBLICATIONS

Hikita, et al., 1.5 GHz SAW Miniature Antenna Duplexer Used in Personal Digital Cellular, *IEICE Trans. Electron.*, vol. E79–C, No. 5, pp. 664–670 (May 1996).

International Search Report, International Application No. PCT/US99/24780.

Crowhurst, "3–Way Crossover Design", Radio–Electronics, pp. 137–143, Jan. 1957.

Wheeler, et al; "A Solid State Amplifier for Satellite Communications," Microwave Journal, vol. 18, No. 7, Jul. 1975 pp 52–55.

*Primary Examiner*—Reinhard J. Eisenzopf
*Assistant Examiner*—Lester G. Kincaid
(74) *Attorney, Agent, or Firm*—Myers Bigel Sibley & Sajovec (57) ABSTRACT

A power amplifier circuit has a driver amplifier stage including a low band driver amplifier and a high band driver amplifier. A final amplifier stage includes a linear mode amplifier for amplifying digitally modulated signals and a saturated (nonlinear) mode amplifier for amplifying frequency modulated (analog) signals. A switching network interconnects the driver amplifier stage and the final amplifier stage. Depending on the desired mode of operation, an appropriate driver amplifier can be coupled to an appropriate final amplifier to most effectively and efficiently amplify analog or digital RF signals in either of a plurality of frequency bands. A matching circuit is coupled to the linear mode final amplifier for impedance matching and for separating D-AMPS (800 MHz band) and PCS (1900 MHz band) digital signals. A power impedance matching circuit is coupled to the output of the saturated mode final amplifier. In one embodiment, an isolator is coupled to the output of one or more of the low band or high band outputs of the duplex matching circuit. In the low band analog path, a duplexer is provided ahead of the coupling means for reducing the RF power requirements on the coupling means. The switching network and input filter stage may precede a driver amplifier stage.

21 Claims, 9 Drawing Sheets

U.S. PATENT DOCUMENTS

| | | |
|---|---|---|
| 5,155,724 | 10/1992 | Edwards ................. 370/297 |
| 5,175,871 | 12/1992 | Kunkel ..................... 455/69 |
| 5,248,979 | 9/1993 | Orme et al. ............. 342/58 |
| 5,258,728 | 11/1993 | Taniyoshi et al. .......... 333/132 |
| 5,347,229 | 9/1994 | Suckling et al. ........ 330/251 |
| 5,392,463 | 2/1995 | Yamada .................... 455/93 |
| 5,423,078 | 6/1995 | Epperson et al. . |
| 5,438,684 | 8/1995 | Schwent et al. . |
| 5,483,209 | 1/1996 | Takayama . |
| 5,530,923 | 6/1996 | Heinonen et al. .......... 455/126 |
| 5,541,554 | 7/1996 | Stengel et al. . |
| 5,546,051 | 8/1996 | Koizumi et al. .......... 330/297 |
| 5,550,895 | 8/1996 | Burson et al. ........... 455/552 |
| 5,640,686 | 6/1997 | Norimatsu ................ 455/74 |
| 5,673,287 | 9/1997 | Colvis et al. ............ 375/216 |
| 5,774,017 | 6/1998 | Adar . |
| 5,884,149 | 3/1999 | Jaakola . |
| 5,969,582 | 10/1999 | Boesch et al. .......... 333/129 |

FOREIGN PATENT DOCUMENTS

| | | |
|---|---|---|
| 744831 | 11/1996 | (EP) . |
| 0823751 A2 | 2/1998 | (EP) . |
| 0837559 A1 | 4/1998 | (EP) . |
| 55-149518 | 11/1980 | (JP) . |
| 07312523 | 11/1995 | (JP) . |
| 08125450 | 5/1996 | (JP) . |
| WO9710621 | 3/1997 | (WO) . |
| WO9847222 | 10/1998 | (WO) . |
| WO 99/17445 | 4/1999 | (WO) . |
| WO9917445 | 4/1999 | (WO) . |

DUAL-BAND, DUAL-MODE POWER AMPLIFIER WITH REDUCED POWER LOSS

RELATED APPLICATIONS

This application is a continuation-in-part of copending U.S. patent application Ser. No. 09/094,515 filed Jun. 10, 1998 (Attorney Docket P09698-RMOT), which is a continuation in part of U.S. patent application Ser. No. 08/888,168, now U.S. Pat. No. 5,969,582 filed Jul. 3, 1997 (Attorney Docket P08247-RMOT)and a continuation-in-part of U.S. patent application Ser. No. 08/939,870, now U.S. Pat. No. 6,091,966 filed Sep. 29, 1997 (Attorney Docket P08521-RMOT), each of which is assigned to the assignee of the present application and each of which is hereby incorporated by reference.

BACKGROUND OF THE INVENTION

1. Field of Invention

The present invention relates generally to power amplifiers and in particular to a dual-band, dual-mode power amplifier.

2. Description of Related Art

In the United States, cellular operating licenses have been awarded by the Federal Communication Commission (FCC) pursuant to a licensing scheme which divides the country into geographic service markets. Cellular licenses were originally granted for radio frequency (RF) blocks in the 800 MHz range. Most 800 MHz cellular telephone systems in the United States utilize the Advanced Mobile Phone Service (AMPS) analog air interface standard. A later generation air interface standard for the 800 MHz band, known as D-AMPS, has subsequently been developed and implemented. The D-AMPS standard comprises both digital and analog cellular communication. Thus, there are presently both analog (AMPS) and digital (D-AMPS) cellular telephone networks in operation at 800 MHz in the United States.

In response to increased demand for cellular services, a number of digital air interface standards were developed for providing efficient digital communication of voice, data, fax and text messages under the umbrella of "personal communications services" or PCS.

Operational PCS systems, such as systems based on the GSM TDMA (Time Division Multiple Access) or IS-95 CDMA (Code Division Multiple Access) air interface standards, are being implemented in the United States in the 1900 MHz frequency range. Meanwhile, existing 800 MHz cellular systems are continuing to operate.

Thus, there are presently operating in the United States analog and digital cellular systems at 800 MHz and digital PCS systems at 1900 MHz. Mobile subscribers who desire to receive services from systems operating at 800 MHz and from systems operating at 1900 MHz must either use two different mobile transceivers capable of operating within the cellular or 800 MHz band and the PCS or 1900 MHz band, respectively, or, preferably, use a single "dual-band" mobile transceiver which can receive and transmit RF signals in both frequency bands. Moreover, mobile subscribers who wish to communicate using both analog and digital systems must either use two different mobile transceivers or, preferably, use a single "dual-mode" transceiver. Ideally, a mobile transceiver is capable of both dual-mode and dual-band operation to provide the user with maximum flexibility and functionality.

A problem arises, however, in that the power amplifier used in a mobile transceiver is typically optimized for use in a particular band (i.e. PCS or AMPS) and in a particular mode (i.e. analog or digital). This problem is manifested in two ways: as an impedance matching problem and as an amplifier biasing problem.

For maximum efficiency, the impedance at the output of the amplifier must be matched to the impedance of a duplexer/diplexer prior to transmission. However, the impedance of the matching circuit is dependent on the frequency of operation. Thus, a conventional matching circuit optimized for matching the impedance of an amplifier at 800 MHz will generally not optimally match the impedance of the same amplifier operating at 1900 MHz. Moreover, the impedance of the amplifier is dependent on the mode of operation. Thus, a conventional matching circuit optimized for matching the impedance of an amplifier operating at 800 MHz in the AMPS mode will not adequately match the impedance of the same amplifier operating at 800 MHz in the D-AMPS digital mode.

The biasing problem arises due to the fact that the efficiency of an amplifier is dependent on the mode or class of operation of the amplifier which is determined by the modulation technique employed. Typically, analog communication systems employ well known frequency modulation (FM) techniques to modulate analog information onto a carrier signal, while digital communication systems employ digital modulation schemes, such as $\pi/4$ DQPSK (Differential Quadrature Phase Shift Keying) modulation. Signals transmitted using frequency modulation are most efficiently amplified by a power amplifier biased and operating in non-linear or saturated mode. Signals transmitted using $\pi/4$ DQPSK modulation, on the other hand, are most efficiently amplified by a power amplifier biased and operating in linear mode.

Figure 1:
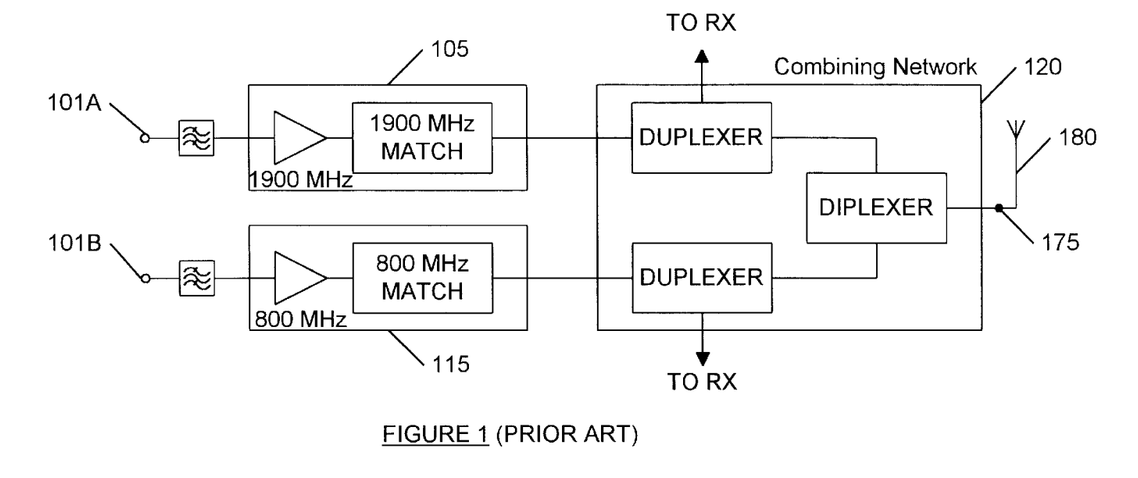
FIG. 1 is a schematic diagram of a dual amplifier chain configuration known in the art.

One possible solution to these problems is to provide a separate amplifier chain for both high-band (1900 MHz) and low-band (800 MHz) operation, as illustrated in FIG. 1. However, this solution is expensive, redundant and wasteful. Moreover, the problem of biasing the low-band amplifier still exists, since the low-band amplifier must amplify both digital and analog signals.

In transceivers having a single amplifier chain, one possible solution to the impedance matching problem is to provide the amplifier with separate, switched high-pass and low-pass matching networks at its output. However, the switch must be capable of handling high power, which tends to require a large, costly switch. Moreover, the match at 800 MHz will necessarily be a blended match, causing a loss of efficiency in the analog mode.

Another solution to the impedance matching problem is to provide a broadband power matching circuit covering both desired frequency bands and having peaks at the transmit bands. Such a configuration would tend to waste bandwidth, however, when the desired match frequencies differ by an octave or more and the desired bandwidth in each band is relatively narrow. Fano's Limit shows that there is a physical limitation on broadband matching when a reactive element (such as the drain-source capacitance of a transistor) is present.

In transceivers having a single amplifier chain, prior art solutions to the impedance matching problem address the biasing problem by providing separate bias levels, although the impedance match remains constant. If a single amplifier is used to amplify both analog and digital signals, the amplifier must be biased to barely meet linearity requirements while retaining as much analog efficiency as possible. Such an arrangement tends to be inefficient. As radiotelephones become smaller and power consumption requirements become stricter, such inefficient operation is highly undesirable.

Therefore, there is a need in the art for a power amplifier circuit capable of efficient operation in both 800 MHz and 1900 MHz systems and in both analog and digital systems. Such a dual-band, dual mode power amplifier preferably provides an integrated, efficient solution to the problems described above.

A useful dual-band dual mode power amplifier design must also take into account the fact that power consumption is an ever greater concern in modern cellular telephones. In order to reduce the physical size of modern cellular telephones, cellular telephone batteries have been reduced in size from four or five cells to three cells. With fewer cells, there is less energy available to power the cellular telephone, resulting in shorter effective "talk time." An additional effect of the reduction in size of cellular telephones and cellular telephone batteries is that heat dissipated from the operation of the cellular telephone's circuitry is confined to a smaller physical area.

Thus, in a dual-band dual-mode cellular telephone, there is a pressing need to provide a power amplifier with low power consumption characteristics.

SUMMARY OF THE INVENTION

It is therefore an object of the present invention to provide a power amplifier circuit for a radio transceiver capable of efficiently amplifying RF signals in a linear or saturated mode of operation.

It is a further object of the present invention to provide a power amplifier circuit for efficiently amplifying RF signals in a plurality of frequency bands or ranges with low current consumption.

It is a further object of the present invention to provide a dual-band, dual-mode power amplifier circuit that may be selectably placed in a linear mode of operation for amplifying DQPSK modulated signals and a saturated mode of operation for amplifying frequency modulated signals.

The foregoing and other objects are accomplished in a power amplifier circuit having a driver amplifier stage including a low band driver amplifier and a high band driver amplifier. A final amplifier stage includes a TDMA amplifier for amplifying digitally modulated signals and a saturated (nonlinear) mode amplifier for amplifying frequency modulated (analog) signals. A switching network and input filtering stage interconnects the driver amplifier stage and the final amplifier stage. Depending on the desired mode of operation, an appropriate driver amplifier can be coupled to an appropriate final amplifier to most effectively and efficiently amplify analog or digital RF signals in either of a plurality of frequency bands.

A diplex matching circuit is coupled to the linear mode final amplifier for impedance matching and for separating DAMPS (800 MHz band) and PCS (1900 MHz band) digital signals. A power impedance matching circuit is coupled to the output of the saturated mode final amplifier.

The amplifier circuit includes means for selectably placing the amplifier circuit in a linear mode or a saturated mode, corresponding to digital and analog modes of operation of the radiotelephone, respectively. In the linear or digital mode, the linear final amplifier is biased in the on state and the saturated mode amplifier may be biased in the off state. Similarly, in the saturated or analog mode of operation, the saturated mode final amplifier is biased in the on state and the linear amplifier may be biased in the off state.

The amplifier circuit may include means for selectably coupling either the first diplex matching circuit output or the low pass matching circuit output to an output line when the amplifier circuit is selectably placed in linear mode or saturated mode, respectively.

In one embodiment, an isolator is coupled to the output of one or more of the low band or high band outputs of the diplex matching circuit.

In the low band analog path, a duplexer is provided ahead of the coupling means for reducing the RF power requirements on the coupling means.

In another embodiment, the switching network and input filter stage precedes a dual driver amplifier stage in order to improve power dissipation.

In still another embodiment, separate RF power amplifier chains are provided for each mode of operation to further reduce wasted energy.

These and other objects of the invention, together with features and advantages thereof will become apparent from the following detailed specification when read with the accompanying drawings in which like reference numerals refer to like elements.

DETAILED DESCRIPTION OF THE PREFERRED EMBODIMENTS

The present invention will now be described with reference to the accompanying drawings, in which preferred embodiments of the invention are shown. However, this invention may be embodied in many different forms and should not be construed as limited to the specific embodiments shown. Rather, the preferred embodiments are provided so that this disclosure is thorough and complete, and will fully convey the scope of the invention to those skilled in the art.

In this application, the terms "duplexer" and "diplexer both refer to a three port, frequency selective splitter. A duplexer is used to enable an RF transceiver to simultaneously transmit and receive on nearly adjacent frequencies using a common antenna, whereas a diplexer separates input signals into high band or low band signals.

Figure 2:
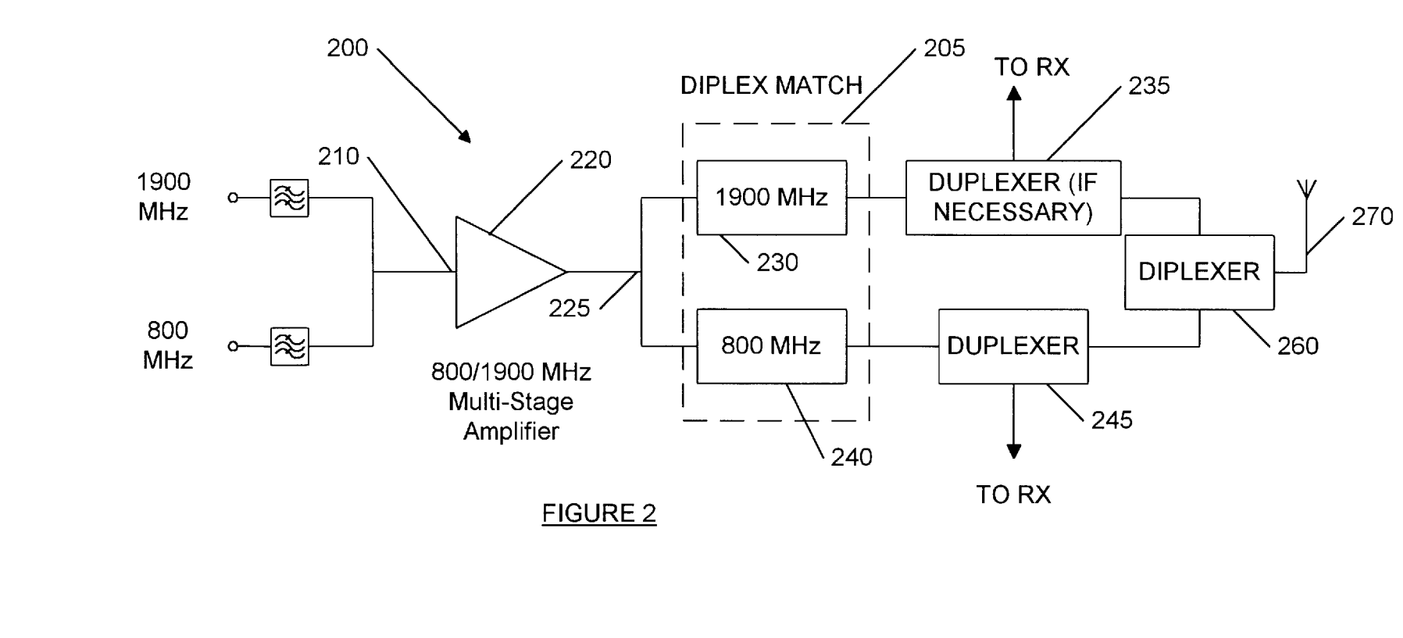
FIG. 2 is a schematic diagram of a single amplifier chain with diplex power matching circuit for dual band operation.

Referring first to FIG. 2, a dual-band power amplifier circuit is indicated generally by reference numeral 200. Power amplifier circuit 200 has a diplex matching circuit 205 for matching the impedance of a multi-band power amplifier. Radio Frequency (RF) signals are input to a multi-band amplifier 220 at RF input port 210. Amplifier 220 amplifies the RF signals and outputs the amplified RF signals to a diplex power matching circuit 205 at port 225.

In the embodiment shown in FIG. 2, the amplified RF signals may fall into one of two frequency bands. However, it will be readily apparent to one skilled in the art that the present invention could modified for use in connection with a power amplifier capable of amplifying RF signals contained in more than two frequency bands.

RF signals falling in the first frequency band will be passed by filter/match circuit 230 to duplexer 235. Likewise, RF signals falling in the second frequency band will be passed by filter/match circuit 240 to duplexer 245.

Filter/match circuit 230 blocks RF signals in the second frequency band while providing a suitable impedance match for signals in the first frequency band. Likewise, filter/match circuit 240 blocks RF signals in the first frequency band while providing a suitable impedance match for signals in the second frequency band.

The output duplexer 235 is coupled to diplexer 260 for transmission using antenna 270. Depending on the communication system in which the amplifier 200 is being used and whether full duplex operation at 1900 MHz is required, duplexer 235 may or may not be necessary. Likewise, the output of duplexer 245 is coupled to diplexer 260 for transmission using antenna 270.

The embodiment illustrated in FIG. 2 and implementations thereof are described in greater detail in copending U.S. patent application Ser. No. 08/888,168 (Attorney Docket EUS00502).

Figure 3:
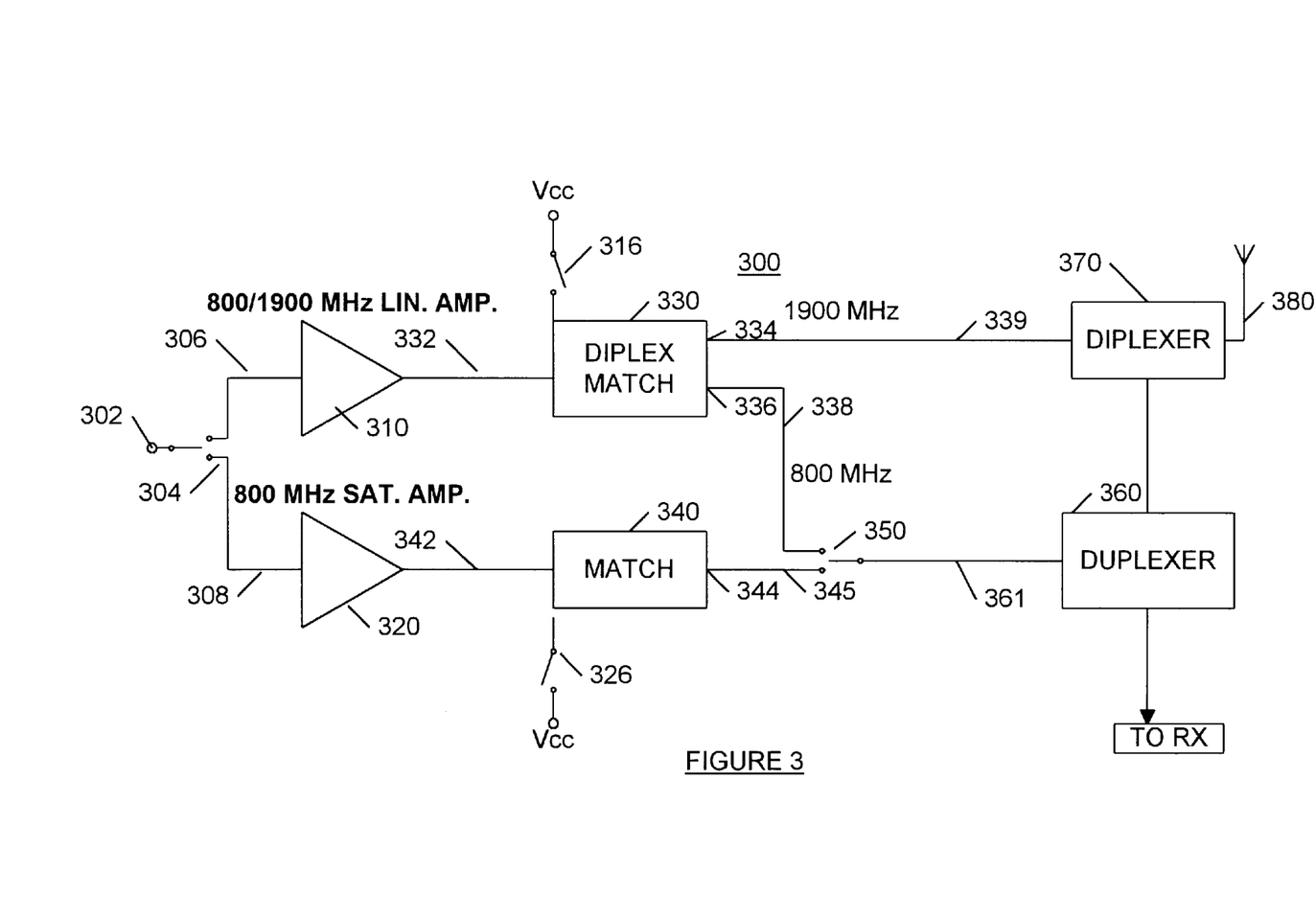
FIG. 3 is a schematic diagram of a dual band, dual mode amplifier chain.

Referring now to FIG. 3, a dual-mode, dual-band amplifier circuit is indicated generally by reference numeral 300. Amplifier circuit 300 is advantageously included in the transmitter or transceiver of a radiotelephone (not shown) for amplifying both analog and digital signals in two different frequency bands or ranges, thereby providing the radiotelephone with dual-band, dual-mode functionality. Amplifier circuit 300 includes an RF input port 302 which is coupled to a mode select switch 304. Depending on whether the radiotelephone is being operated in a digital or analog mode, the setting of mode select switch 304 will cause input RF signals to be transmitted down digital path 306 or analog path 308, respectively. The position of mode select switch 304 is controlled by a mode control signal from a microprocessor (not shown) within the radiotelephone. The control signal provided by the microprocessor is used to selectively place amplifier circuit 300 in a linear mode or a saturated (nonlinear) mode of operation.

Digital path 306 includes a linear amplifier 310, which efficiently amplifies signals which have been modulated using a linear modulation technique such as DQPSK modulation techniques. The output of linear amplifier 310 is coupled to a diplex matching circuit 330 which efficiently separates 1900 MHz signals from 800 MHz signals while providing an impedance match for linear amplifier 310 in both frequency ranges. The structure and function of diplex matching circuit 330 is described in greater detail below.

Diplex matching circuit 330 has a 1900 MHz output 334 and an 800 MHz output 336. The 1900 MHz output is coupled via path 339 to a diplexer 370, which couples the 1900 MHz output signal to an antenna 380. Additionally, a duplexer may be provided between the 1900 MHz output 334 and diplexer 370 if full duplex operation is desired for 1900 MHz operation, for example in a CDMA or multirate TDMA system.

Analog path 308 includes a nonlinear amplifier 320 which efficiently amplifies frequency modulated signals. The output of nonlinear amplifier 320 is coupled to a matching circuit 340 which provides a 50-Ohm impedance match for nonlinear amplifier 320. Matching circuit 340 also helps suppress harmonic content that could feed back down the 1900 MHz path 339.

Since separate linear and nonlinear amplifiers 310, 320, respectively are provided, the nonlinear amplifier may be operated as a deeply saturated Class C amplifier or as a switched mode class E amplifier. Previous solutions in which a single amplifier was used for both linear and nonlinear amplification required that the amplifier be biased (in Class AB) to barely meet linearity requirements while retaining as much nonlinear efficiency as possible. The result was a blended match that was not optimal for either linear or nonlinear amplification. The present invention overcomes this limitation while providing an amplifier circuit that can effectively and efficiently amplify signals in different frequency bands.

The output of matching circuit 340 on line 345 and the 800 MHz output of diplex matching circuit 330 on line 338 are provided to a high power switch 350. High power switch 350 couples either the 800 MHz output of diplex match circuit 330 (corresponding to a digital 800 MHz signal) or the output of matching circuit 340 (corresponding to an analog 800 MHz signal) to duplexer 360 via output line 361, depending on whether the cellular telephone is being operated in a digital or analog mode, respectively. As with mode select switch 304, high power switch 350 is controlled by the mode control signal from the radiotelephone's microprocessor. Additionally, high power switch 350 provides isolation for linear amplifier 310, thus preventing linear amplifier 310 from being loaded by nonlinear amplifier 320 and matching circuit 340.

DC biasing for linear amplifier 310 and nonlinear amplifier 320 is provided by switching Vcc inputs 316, 326 on or off depending on the desired mode of operation of the cellular telephone (i.e. digital or analog).

Duplexer 360 is a conventional duplexer designed to permit full duplex operation at 800 MHz. Duplexer 360 couples 800 MHz signals to diplexer 370, which in turn couples the signals to antenna 380 for transmission.

The embodiment illustrated in FIG. 3 is particularly suited for use in a TDMA transceiver, which operates at half duplex at 1900 MHz. However, as described above, the circuit can be easily adapted for use in a CDMA or multirate TDMA transceiver by providing an additional duplexer in path 339 to permit full duplex operation at 1900 MHz.

Diplex matching circuit 330, which is essentially the same circuit as diplex matching circuit 205 shown in FIG. 2, is described in detail in copending U.S. application Ser. No. 08/888,168. The embodiment illustrated in FIG. 3 and implementations thereof are described in greater detail in copending U.S. application Ser. No. 08/939,870.

Figure 4:
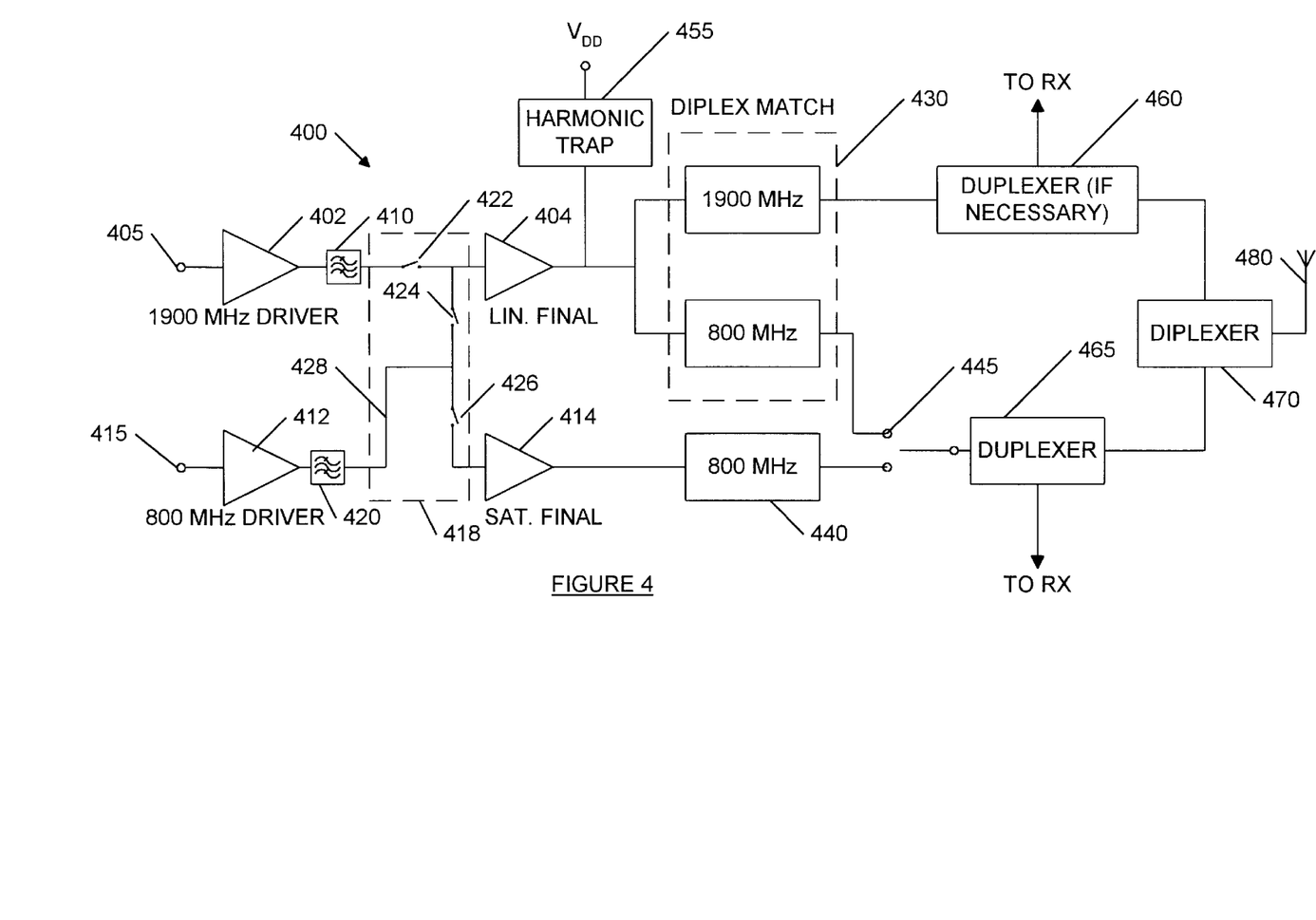
FIG. 4 is a schematic diagram of another embodiment of a dual band, dual mode amplifier chain.

Referring now to FIG. 4, a second dual-band dual-mode amplifier architecture is indicated generally as 400. Amplifier 400 improves on the designs illustrated in FIGS. 2 and 3 by separating the amplifier into a driver stage and a final stage, and selectively coupling the appropriate driver and final stages depending on the desired mode of operation of the amplifier 400. Amplifier 400 includes a 1900 MHz driver amplifier 402 tuned and biased to efficiently amplify signals in the 1900 MHz frequency band and an 800 MHz driver amplifier 412 tuned and biased to efficiently amplify signals in the 800 MHz frequency band.

Amplifier 400 also includes a pair of final stage amplifiers 404 and 414. Final stage amplifier 404 is biased and tuned for linear operation as a class AB amplifier to efficiently amplify digitally modulated RF signals, while final stage amplifier 414 is biased and tuned for saturated operation in an efficient mode of operation, such as a deeply saturated class C amplifier or a switched mode class E amplifier or some other highly efficient mode of operation to efficiently amplify frequency modulated analog RF signals.

The driver stage amplifiers 402, 412 are connected to the final stage amplifiers 404, 414 by means of a switching network 418 which includes switches 422, 424 and 426. Each of switches 422, 424 and 426 may be a field-effect transistor (FET) switch whose design is well known to those skilled in the art. Other suitable types of switches may be substituted by those having skill in the art. The open/closed state of switches 422, 424 and 426 is controllable by means of control lines (not shown) from an associated microprocessor or other control logic (not shown).

Switch 422 couples the output of 1900 MHz driver amplifier 402 to the input of linear final amplifier 404. The output of 800 MHz driver amplifier 412 is coupled to node 428. Node 428 is in turn coupled to the input of linear final amplifier 404 via switch 424 and to the input of saturated final amplifier 414 via switch 426. The positions of switches 422, 424 and 426 are controlled by a mode control signal from a microprocessor (not shown) within the radiotelephone.

The signal output by final amplifier 404 is passed through matching network 430 which filters and passes the signal to duplexer 460 (if necessary) or duplexer 465 (via switch 445) depending on the frequency content of the signal. Preferably, matching network 430 is a diplex matching circuit as described in copending U.S. application Ser. No. 08/888, 168.

In one embodiment, a first filter 410 is provided between the output of 1900 MHz driver amplifier 402 and switch 422, and a second filter 420 is provided between the output of 800 MHz driver amplifier 412 and node 428. These filters 410, 420 filter the input signals prior to the final gain stage thereby providing receive band noise rejection and reduction of the harmonic content of the signal. In one embodiment, filters 410, 420 are surface acoustic wave (SAW) bandpass filters, the design of which is well known in the art.

By providing a filtered signal to the final amplifier stage, final amplification by the linear amplifier is more effective. Placing filters between the gain stages of the amplifier allows the duplexers 460, 465 to be implemented with fewer poles, decreasing the insertion loss after the final amplifier gain stage and resulting in lower dc current drain. Because of the lower insertion loss of amplifier 400, the final amplifier stage does not need to develop as much output RF power. This has a number of desirable consequences, including a smaller die size and lower dc current consumption.

Figure 5:
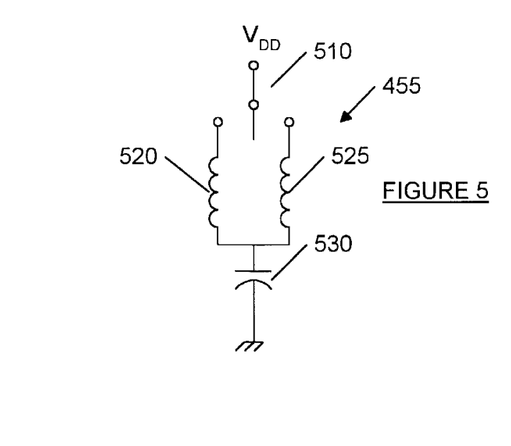
FIG. 5 is a circuit diagram of a harmonic trap for use with the embodiment of FIG. 4.

In one embodiment, a harmonic trap 455 is coupled to the input of diplex matching circuit 430. The function of harmonic trap 455 is to reduce the harmonic content of signals output by diplex matching circuit 430 and to supply VDD to final stage amplifier 404. FIG. 5 shows an embodiment of harmonic trap 455, which includes a high-power switch 510 coupled to a pair of parallel switchable inductors 520, 525.

Inductors 520, 525 are in turn coupled to capacitor 530, which is coupled to the input of diplex matching circuit 430. Inductor 520 and capacitor 530 combine to form a parallel resonant circuit that is resonant at 800 MHz, while inductor 525 and capacitor 530 combine to form a parallel resonant circuit that is resonant at 1900 MHz. Thus, depending on the state of switch 510 (which is set according to the operating state of amplifier 400), the harmonic trap 455 will operate to attenuate harmonic signals in the 800 MHz band or the 1900 MHz band. As with switches 422, 424 and 426, switch 510 is controllable by means of control lines (not shown) from an associated microprocessor or other control logic (not shown).

Since the linear final amplifier 404 is operated in a class AB mode, harmonic content of the output signal is higher than it would be using a class A amplifier. Providing a harmonic trap at the output of final amplifier 404 therefore increases the efficiency of final amplifier 404 by constraining the output energy to desired frequencies.

Referring again to FIG. 4, the amplifier may be operated in one of a number of selectable modes to amplify analog or digital signals in the 800 MHz frequency band or digital signals in the 1900 MHz frequency band. For the 1900 MHz mode of operation, switch 422 is closed, while switch 424 is open. Additionally, in the 1900 MHz mode of operation switch 426 may be open to provide additional isolation of the final stage amplifiers 404, 414. Digitally modulated input signals in the 1900 MHz frequency band are input to amplifier 400 via input terminal 405 and provided to 1900 MHz driver amplifier 402. The signal output by 1900 MHz driver amplifier 402 is coupled to the input of final amplifier 404 which, as noted above, is biased for operation in linear mode. Amplifier 404 efficiently amplifies the digitally modulated signal and outputs the amplified signal to diplex matching circuit 430.

To amplify analog RF signals in the 800 MHz band, (800 MHz analog mode) switches 422 and 424 are open, while switch 426 is closed. Frequency modulated (i.e. analog or FM) input signals in the 800 MHz frequency band are input to amplifier 400 via input terminal 415 and provided to 800 MHz driver amplifier 412. The signal output by 800 MHz driver amplifier 412 is coupled to the input of final amplifier 414 via closed switch 426. Final amplifier 414 is biased for operation in saturated mode, and therefore efficiently amplifies the FM signal and outputs the amplified signal to matching circuit 440.

To amplify digitally-modulated (e.g. π/4 DQPSK) RF signals in the 800 MHz band, (800 MHz digital mode) switches 422 and 426 are open, while switch 424 is closed. Digitally modulated input signals in the 800 MHz frequency band are input to amplifier 400 via input terminal 415 and provided to 800 MHz driver amplifier 412. The signal output by 800 MHz driver amplifier 412 is coupled to the input of final amplifier 404 via node 428 and switch 426. As noted above, final amplifier 404 is biased for operation in linear mode. Amplifier 404 efficiently amplifies the digitally modulated signal and outputs the amplified signal to diplex matching circuit 430. The operation of switch 445 is similar to that of switch 350 described in reference to FIG. 3.

As noted above, in modern cellular telephones, power consumption is an ever greater concern. In order to reduce the physical size of modern cellular telephones, cellular telephone batteries have been reduced in size from four or five cells to three cells. With fewer cells, there is less energy available to power the cellular telephone, resulting in shorter effective "talk time." An additional effect of the reduction in size of cellular telephones and cellular telephone batteries is that heat dissipated from the operation of the cellular telephone's circuitry is confined to a smaller physical area. Therefore, it is highly desirable to minimize the amount of energy wasted in the transmitter circuitry.

To illustrate the effect of power dissipation in a dual band, dual mode power amplifier, we refer again to the known dual band transmitter chain shown in FIG. 1. Assuming that the combining network 120 has a power dissipation equal to L, the voltage supplied to amplifier 105 is equal to V, the power output from amplifier 105 that is actually coupled to the antenna 180 is $P_O$, and that the efficiency of amplifier 105 is E, we may write the following equation for the current drawn into amplifier 105 from the power supply:

$$I=(P_O \cdot L)/(E \cdot V) \qquad (1)$$

That is, the power at the output of amplifier 105 is equal to ($P_O \cdot L$). The difference between the power output by amplifier 105 and the power supplied is termed the dissipated power $P_d$, which may be written as follows:

$$P_d = P_s - P_o \cdot L \qquad (2)$$

Equation (2) may be rewritten as follows:

$$P_d = (V \cdot I) - P_o \cdot L \qquad (3)$$

Using equation (1), we can write equation (3) as follows:

$$P_d = (1/E - 1) \cdot P_o \cdot L \qquad (4)$$

From equations (1) and (4), we see that by reducing the loss L of the combining network, we can reduce the current drawn by the power amplifier, and also reduce the power and heat dissipated in the circuit.

Certain dual-mode, dual-band cellular telephones do not require full duplex operation in digital mode in either frequency band. For example, in dual-mode, dual-band cellular telephones which support the IS-136 or Global System for Mobile Communication (GSM) standards, digital communication is performed using half-duplex operation. Thus, in such systems, a duplexer is only required in the 800 MHz analog path. Since a duplexer is a fairly high loss device (2–3dB), elimination of the duplexers from the digital paths results in significantly less power dissipation in the circuit.

Figure 6:
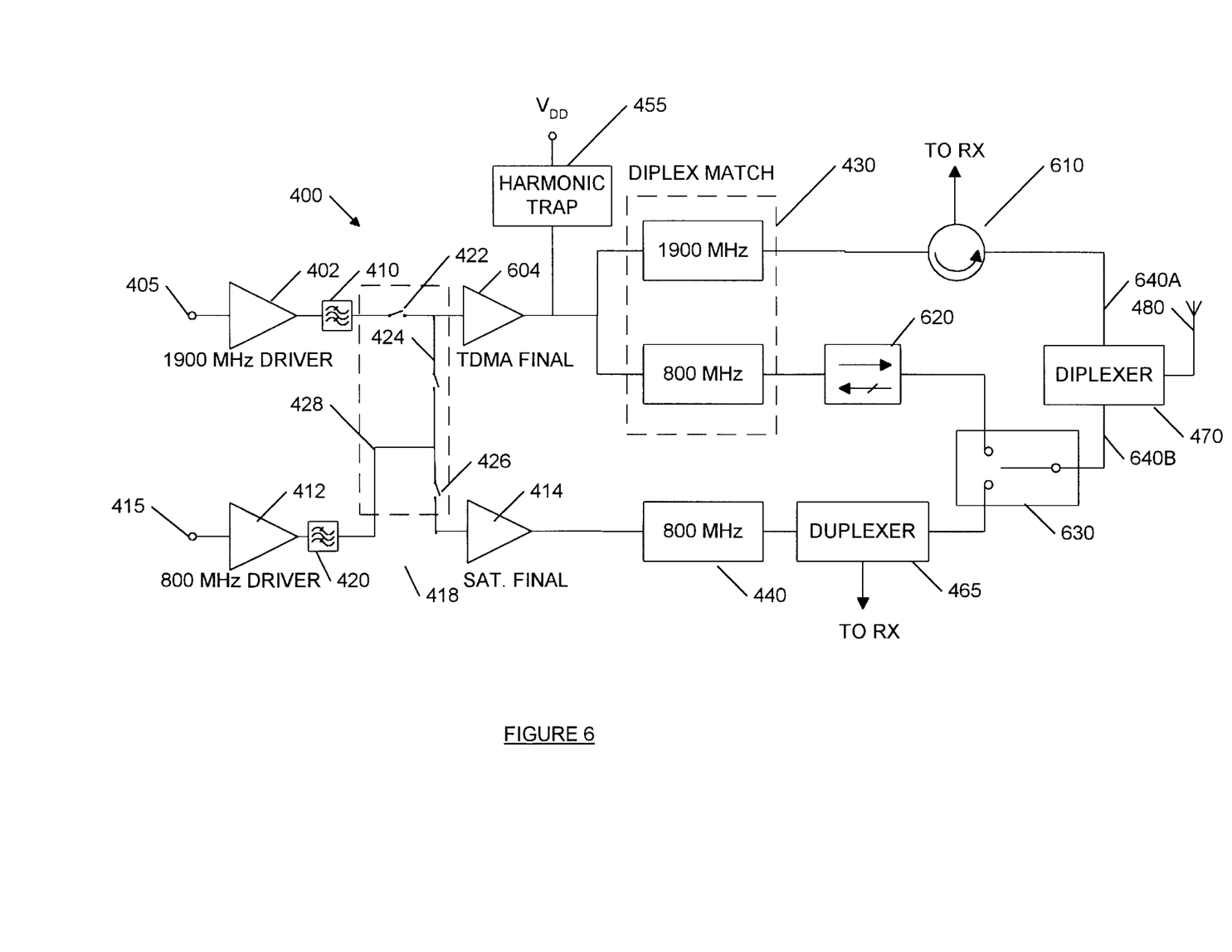
FIG. 6 is a schematic diagram of another embodiment of a dual band, dual mode amplifier chain.

An embodiment of the invention showing elimination of the duplexers from the digital paths is shown in FIG. 6. In amplifier circuit 600 shown in FIG. 6, the duplexer at the 1900 MHz output of diplex match 430 is removed and replaced with circulator 610, which couples signals output by the 1900 MHz match circuit of diplex match 430 to diplexer 470. The 800 MHz output of diplex match 430 is coupled to an isolator 620 which is in turn coupled to high power switch 630. The output of circulator 610 is coupled to diplexer 470 via output line 640A. The output of high power switch 630 is coupled to diplexer 470 via output line 640B. Isolator 620 has a much lower loss than a duplexer, resulting in improved efficiency in 800 MHz linear mode operation.

It will be understood that the term "circulator" refers to a particular type of isolator, namely, a three port device the design of which is well known in the art. Thus, the broad term "isolator" will be understood by those skilled in the art to include circulators as well.

Since it is not needed for 800 MHz linear half-duplex operation, duplexer 645, which separates transmit and receive signals in the 800 MHz band, is moved to the input side of high power switch 630 in the 800 MHz saturated (analog) path. This results in the high power switch 630 having a lower RF power requirement, thereby requiring less physical space to implement on an ASIC. Performance in the 800 MHz saturated modes and 1900 MHz linear modes should not be affected by this change, which should result in a savings of approximately 100 mA in 800 MHz linear mode.

In the embodiment illustrated in FIG. 6, the linear final amplifier is replaced with a TDMA final amplifier for amplifying TDMA signals in the 800 MHz and 1900 MHz band.

Other than as described above, the operation of amplifier circuit 600 is identical to that described in connection with the embodiment illustrated in FIG. 4.

Figure 7:
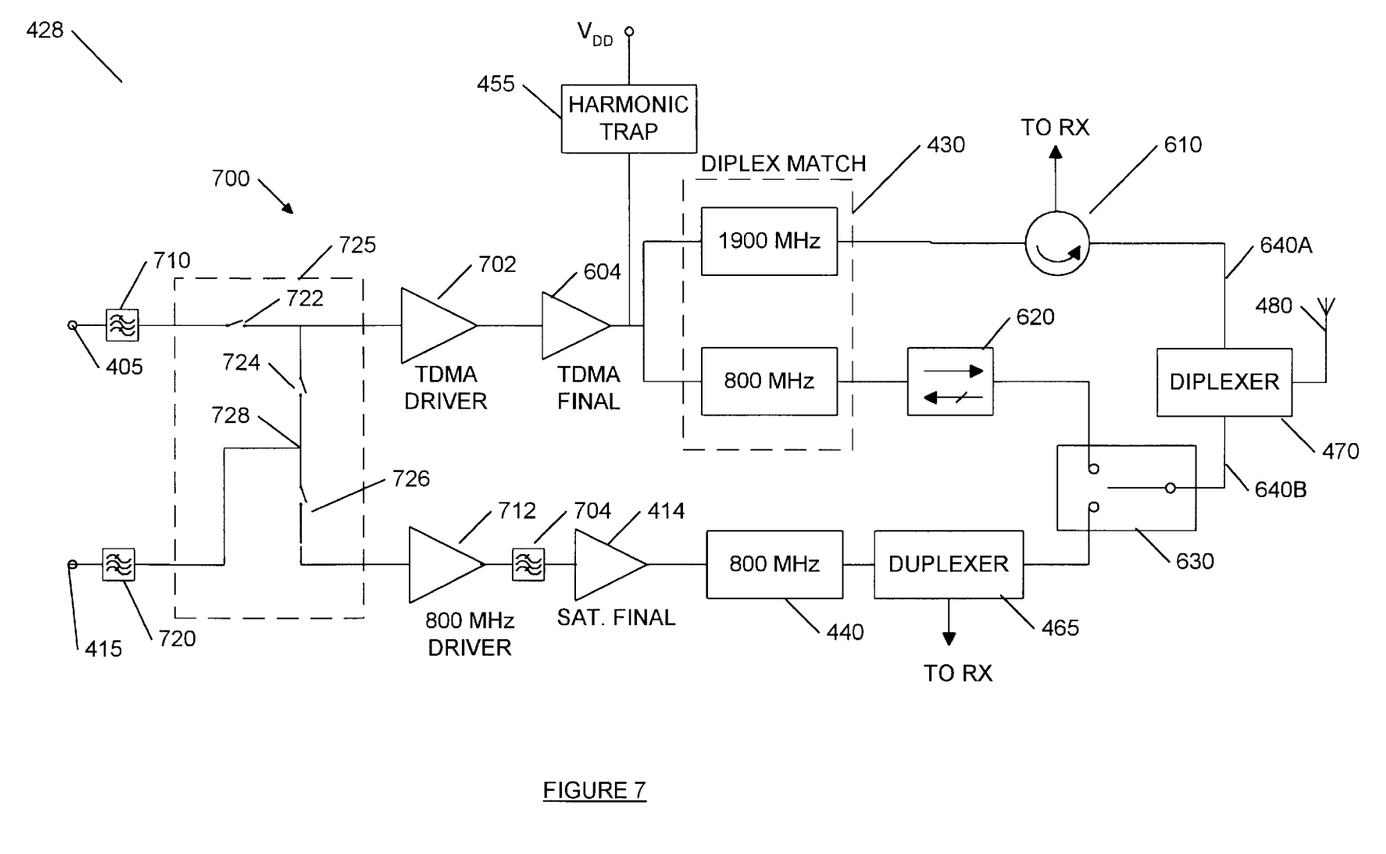
FIG. 7 is a schematic diagram of another embodiment of a dual band, dual mode amplifier chain.

A further embodiment of the present invention is illustrated as circuit 700 in FIG. 7. In the embodiment illustrated therein, the FET switching network 725 and the filters associated with the linear modes have been moved upstream relative to the embodiment of FIG. 6. The 1900 MHz RF input 405 is coupled directly to filter 710, while the 800 MHz RF input 415 is coupled directly to filter 720.

FET switching network 725 comprises switches 722, 724 and 726. Switch 722 is coupled between the output of filter 710 and the input of TDMA driver 702. Switch 724 is coupled between node 728 and the input of TDMA driver 702, while switch 726 is coupled between node 728 and the input of 800 MHz driver 712. The output of filter 720 is coupled to node 728. The positions of switches 722, 724 and 726 are controlled by a mode control signal from a microprocessor (not shown) within the radiotelephone.

As with the embodiment illustrated in FIG. 4, the amplifier may be operated in one of a number of selectable modes to amplify analog or digital signals in the 800 MHz frequency band or digital signals in the 1900 MHz frequency band. For the 1900 MHz mode of operation, switch 722 is closed, while switch 724 is open. Digitally modulated input signals in the 1900 MHz frequency band are input via input terminal 405 and provided to filter 710. The signal output by filter 710 is coupled to the input of TDMA driver amplifier 702 via switch 722. The output of TDMA driver 702 is provided to TDMA final amplifier 604, which efficiently amplifies the digitally modulated signal and outputs the amplified signal to diplex matching circuit 430.

To amplify analog RF signals in the 800 MHz band, (800 MHz analog mode) switches 722 and 724 are open, while switch 726 is closed. Frequency modulated (i.e. analog or FM) input signals in the 800 MHz frequency band are input to amplifier 700 via input terminal 415 and provided to filter 720. The signal output by filter 720 is coupled to the input of 800 MHz driver amplifier 712 via closed switch 726. A second filter 704 is coupled to the output of 800 MHz driver amplifier 712 and to the input of final amplifier 414.

Final amplifier 414 is biased for operation in saturated mode, and therefore efficiently amplifies the FM signal and outputs the amplified signal to matching circuit 440.

To amplify digitally-modulated (e.g. π/4 DQPSK) RF signals in the 800 MHz band, (800 MHz digital mode) switches 722 and 726 are open, while switch 724 is closed. Digitally modulated input signals in the 800 MHz frequency band are input to amplifier 700 via input terminal 415 and provided to filter 720. The signal output by filter 720 is coupled to the input of TDMA driver 702 via node 728 and switch 724. Signals from TDMA driver amplifier 702 are provided to TDMA final amplifier 604. As noted above, final amplifier 604 is biased for operation in linear mode. Amplifier 604 efficiently amplifies the digitally modulated signal and outputs the amplified signal to diplex matching circuit 430.

By moving filters 710, 712 and switching network 725 upstream ahead of the driver amplifiers 702, 712, two goals are accomplished. First, the current dissipated in filters 710, 712 and switching network 725 is reduced, since the power loss occurs at lower power levels, which results in a reduction in current requirements. Second, the RF power that must be handled by the switches 722, 724, 726 is reduced, which reduces the amount of transistor area required to implement the switches.

Figure 8:
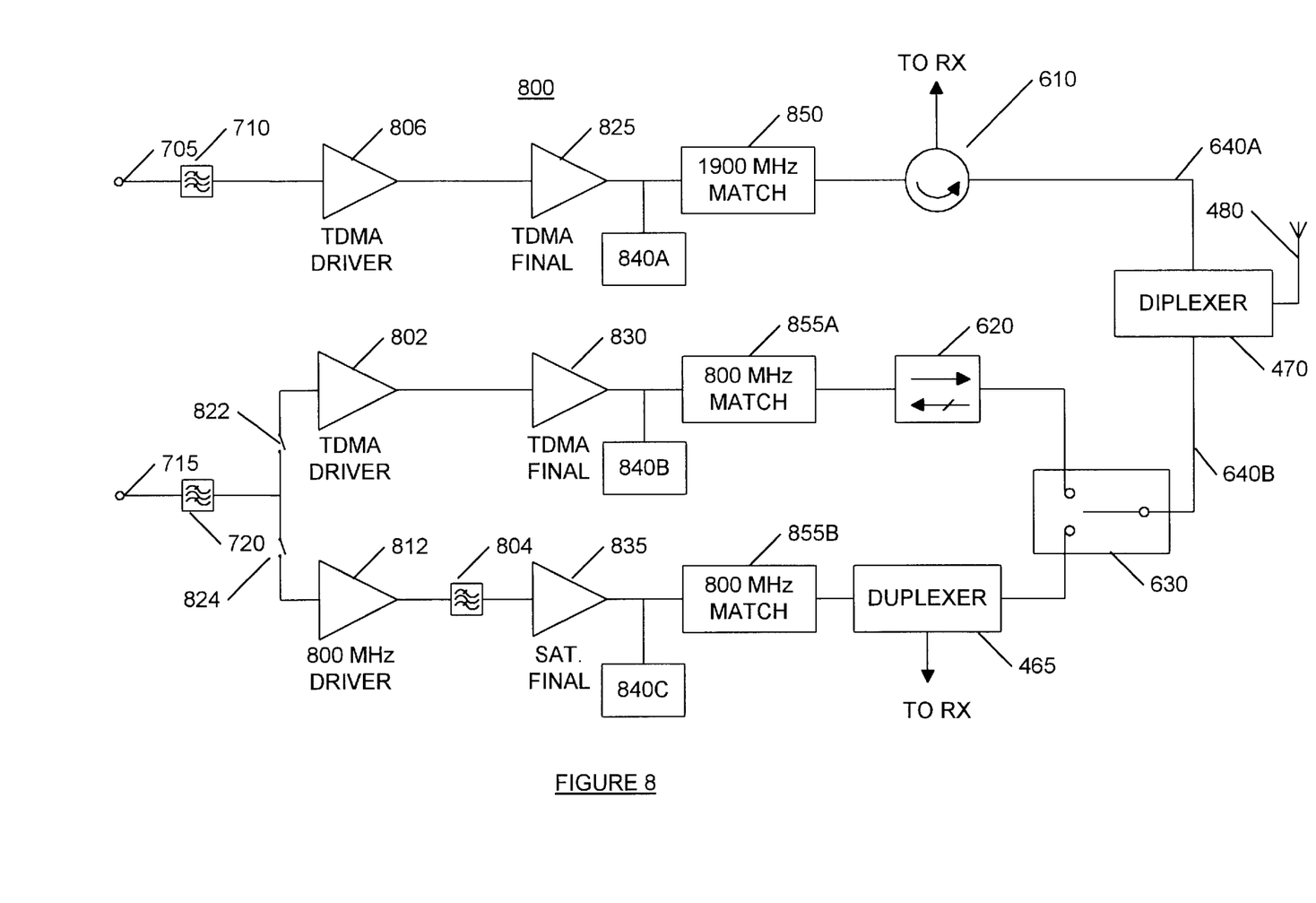
FIG. 8 is a schematic diagram of another embodiment of a dual band, dual mode amplifier chain.

In cases where the TDMA low band (800 MHz) and high band (1900 MHz) modes have significantly different power requirements, it may be advantageous to provide an RF power amplifier chain for each band of operation. An embodiment of such an amplifier is illustrated in FIG. 8. A power amplifier circuit 800 has a high band input terminal 705 and a low band input terminal 715. High band signals input at terminal 705 are passed through filter 710 and to TDMA driver 806 and TDMA final amplifier 825. A harmonic trap 840A is provided at the output of TDMA final amplifier 825. A 1900 MHz matching circuit is provided at the output of TDMA final amplifier 825 to match the impedance of the output signal. The amplified 1900 MHz output signal is then passed through circulator 610 to diplexer 470 for transmission over antenna 480.

Low band signals input at terminal 715 are passed through filter 720 to a mode selection switching network comprising switches 822, 824. For TDMA operation, switch 822 is closed, while switch 824 is open. Thus, in TDMA operation, low band input signals are passed through TDMA driver 802 to TDMA final 830, where they are amplified for transmission. An 800 MHz match circuit 855A is provided at the output of TDMA final amplifier 830. A harmonic trap 840B is provided at the output of TDMA final amplifier 830. Signals passing out of the match circuit 855A are transmitted through an isolator 620 and high power switch 630 to diplexer 470 for transmission over the antenna 480.

Figure 11:
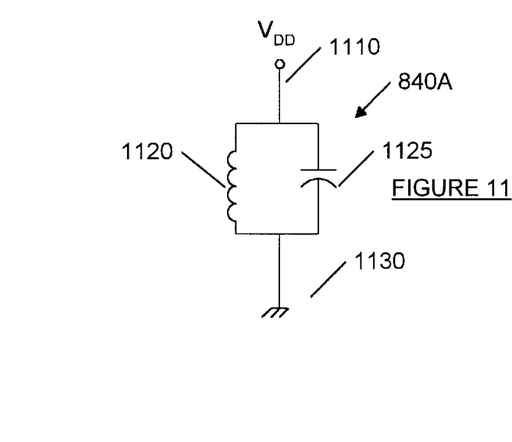
FIG. 11 is a circuit diagram of a harmonic trap for use with the embodiment of FIG. 8.

For analog operation, switch 822 is open and switch 824 is closed, causing input signals to be passed through a low-band analog amplifier chain comprising 800 MHz driver 812, filter 804, saturated final amplifier 835 and 800 MHz match circuit 855B. A harmonic trap 840C is coupled to the output of saturated final amplifier 835. Harmonic traps 840A, 840B and 840C may be implemented as parallel resonant circuits as illustrated in FIG. 11. The function of harmonic traps 840A, 840B and 840C is similar to that described for harmonic trap 455 in connection with FIG. 4, i.e. to reduce the harmonic content of signals output by the matching circuits 850, 855A, 855B and to supply VDD to the final stage amplifiers 825, 830, 835, respectively.

Since separate high-band and low-band TDMA amplifier chains are provided, there is no need for a diplex matching circuit as provided in other embodiments. In comparison with other embodiments, the embodiment of FIG. 8 maximizes the performance of each final amplifier by providing for optimal insertion loss for each mode of operation. Optimizing the design for power requirements in each mode of operation results in optimal die size, cost and current consumption characteristics. Minimizing the loss at each output stage thereby minimizes current consumption and heat loss. Although this configuration may not be ideal in terms of space considerations, it is highly beneficial for minimizing the amount of energy wasted in the circuit if sufficient space is available.

Figure 9:
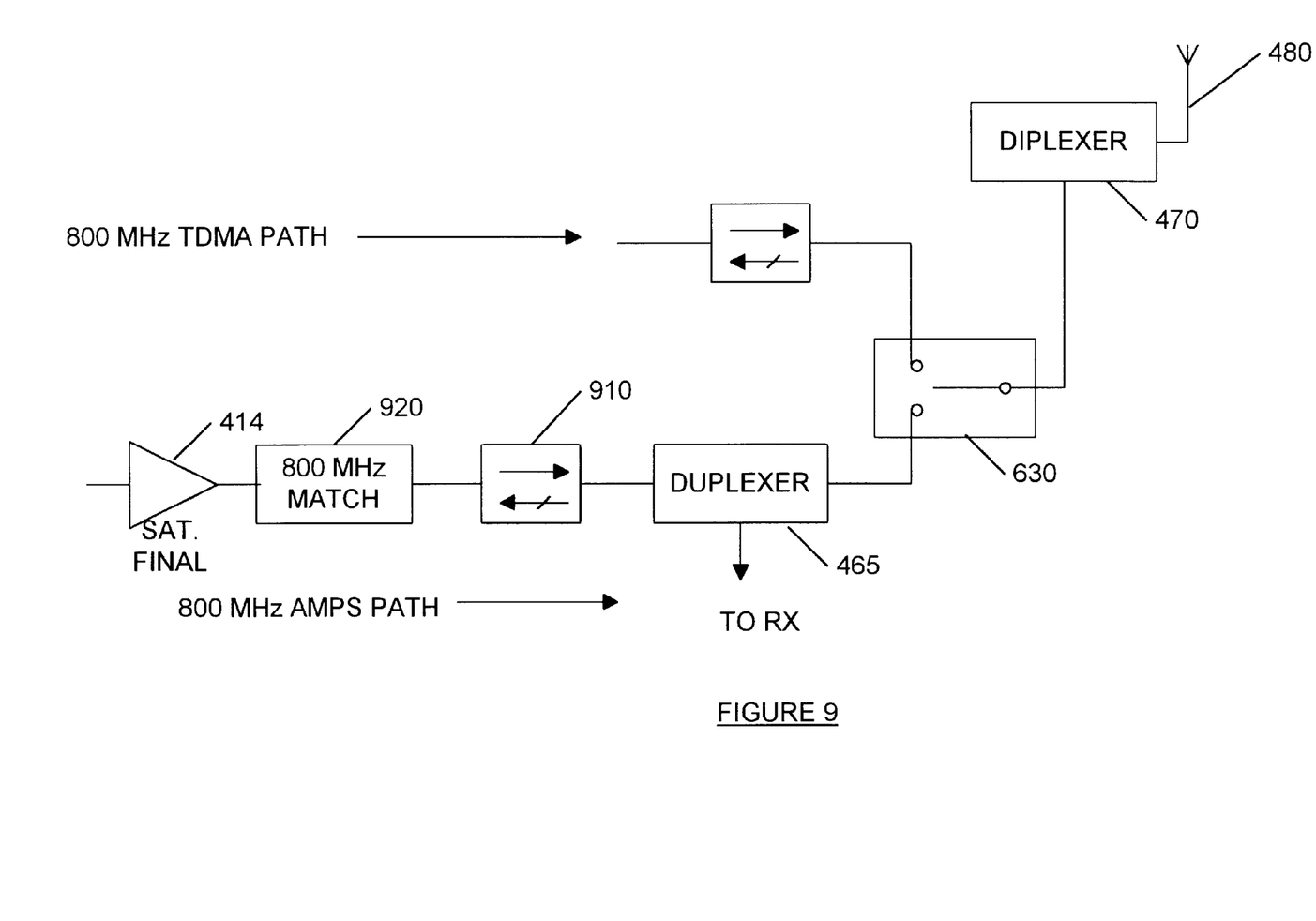
FIG. 9 is a schematic diagram of another embodiment of a dual band, dual mode amplifier chain.

FIG. 9 illustrates a further refinement of the present invention, wherein a low loss isolator 910 is inserted between the 800 MHz match circuit 920 and duplexer 465. Including low loss isolator 910 provides a fixed load to the power match of the saturated final amplifier 414, which maximizes the efficiency of amplifier 414.

Figure 10:
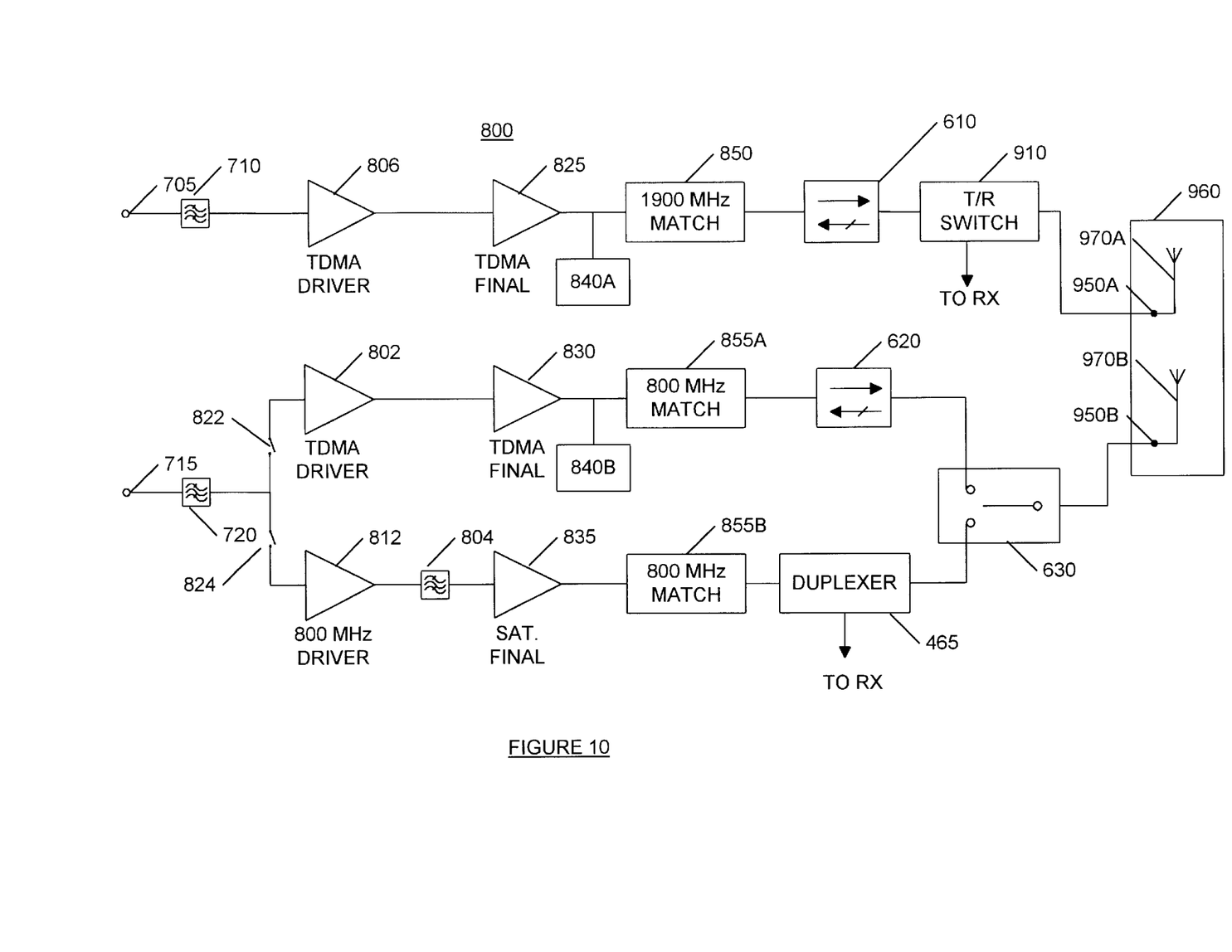
FIG. 10 is a schematic diagram of another embodiment of a dual band, dual mode amplifier chain.

FIG. 10 illustrates yet another refinement of the present invention, wherein the diplexer is eliminated in favor of an antenna structure 960 including a plurality of antennas 970A, 970B and associated antenna feed points 950A, 950B. By eliminating the diplexer, the loss associated with the diplexer is eliminated, further increasing the efficiency and reducing power dissipation in the power amplifier circuit.

While the present invention has been described with respect to its preferred embodiment, those skilled in the art will recognize that the present invention is not limited to the specific embodiment described and illustrated herein. Different embodiments and adaptations besides those shown herein and described as well as many variations, modifications and equivalent arrangements will now be apparent or will be reasonably suggested by the foregoing specification and drawings, without departing from the substance or scope of the invention. Accordingly, it is intended that the invention be limited only by the spirit and scope of the claims appended hereto.

What is claimed is:

1. A power amplifier circuit for amplifying RF signals, said power amplifier circuit selectively operable in a linear mode or a nonlinear mode and selectively operable to amplify RF signals in a first frequency band or a second frequency band, comprising:

first and second RF input terminals for receiving RF signals in first and second frequency bands, respectively;

first and second final amplifiers;

a matching network having and input, a low-band output and a high-band output, the input of said matching network coupled to an output of said first final amplifier;

a switching network for selectively coupling said second RF input terminal to one of said first and second final amplifiers in response to said amplifier circuit being placed in a linear or nonlinear mode of operation, respectively; and an isolator coupled between the high-band output of said matching network and a first output line.

2. A power amplifier circuit as recited in claim 1, further comprising:

an impedance matching circuit coupled to an output of said second final amplifier;

a duplexer coupled to an output of said impedance matching circuit; and switching circuitry, coupled to the low-band output of said matching circuit and an output of said duplexer, for selectively coupling one of the low-band output of said matching network or the output of said duplexer to a second output line when said amplifier circuit is selectively placed in linear mode or nonlinear mode, respectively.

3. A power amplifier circuit as recited in claim 2, further comprising:

an isolator coupled between the low-band output of said matching network and said switching circuitry.

4. A power amplifier circuit as recited in claim 3, wherein said first and second output lines are coupled to a diplexer.

5. A power amplifier circuit as recited in claim 3, further comprising:

first and second driver amplifiers coupled to said first and second RF input terminals, respectively;

said switching network includes a node coupled to an output of said second driver amplifier, a first switch coupled between said first driver amplifier and an input of said first final amplifier, a second switch coupled between said node and said input of said first final amplifier and a third switch coupled between said node and an input of said second final amplifier.

6. A power amplifier circuit as recited in claim 5, further comprising a first filter disposed between said first driver amplifier and said first switch, and a second filter disposed between said second driver amplifier and said node.

7. A power amplifier as recited in claim 6, where in said first and second filters are surface acoustic wave filters.

8. A power amplifier as recited in claim 2, further comprising:
an isolator coupled between said impedance matching circuit and said switching circuitry.

9. A power amplifier circuit for amplifying RF signals, said power amplifier circuit selectively operable in a linear mode or a nonlinear mode and selectively operable to amplify RF signals in a first frequency band or a second frequency band, comprising:
first and second RF input terminals for receiving RF signals in first and second frequency bands, respectively;
first and second driver amplifiers;
first and second final amplifiers coupled to said first and second driver amplifiers, respectively;
a matching network having and input, a low-band output and a high-band output, the input of said matching network coupled to an output of said first final amplifier;
a switching network for selectively coupling said second RF input terminal to one of said first and second driver amplifiers in response to said amplifier circuit being placed in a linear or nonlinear mode of operation, respectively.

10. A power amplifier circuit as recited in claim 1, further comprising:
an isolator coupled between the high-band output of said matching network and a first output line.

11. A power amplifier circuit as recited in claim 9, further comprising:
an impedance matching circuit coupled to an output of said second final amplifier;
a duplexer coupled to an output of said impedance matching circuit; and
switching circuitry, coupled to the low-band output of said matching circuit and an output of said duplexer, for selectively coupling one of the low-band output of said matching network or the output of said duplexer to a second output line when said amplifier circuit is selectively placed in linear mode or nonlinear mode, respectively.

12. A power amplifier circuit as recited in claim 11, further comprising:
an isolator coupled between the low-band output of said matching network and said switching circuitry.

13. A power amplifier circuit as recited in claim 12, wherein said first and second output lines are coupled to a diplexer.

14. A power amplifier circuit as recited in claim 12, wherein:
said switching network includes a node coupled to said second RF input terminal, a first switch coupled between said first RF input terminal and an input of said first driver amplifier, a second switch coupled between said node and said input of said first driver amplifier and a third switch coupled between said node and an input of said second driver amplifier.

15. A power amplifier circuit as recited in claim 14, further comprising a first filter disposed between said first RF input terminal and said first switch, and a second filter disposed between said second RF input terminal and said node.

16. A power amplifier as recited in claim 15, where in said first and second filters are surface acoustic wave filters.

17. A power amplifier as recited in claim 10, further comprising:
an isolator coupled between said impedance matching circuit and said switching circuitry.

18. A power amplifier circuit for amplifying RF signals, said power amplifier circuit selectively operable in a linear mode or a nonlinear mode and selectively operable to amplify RF signals in a first frequency band or a second frequency band, comprising:
first and second RF input terminals for receiving RF signals in first and second frequency bands, respectively;
a first TDMA final amplifier coupled to said first RF input terminal;
a second TDMA final amplifier;
a saturated amplifier; and
a switching network for selectively coupling said second RF input terminal to one of said second TDMA amplifier and said saturated amplifier in response to said amplifier circuit being placed in a linear or nonlinear mode of operation, respectively.

19. A power amplifier as recited in claim 18, further comprising:
a first isolator coupled to an output of said first TDMA amplifier;
a second isolator coupled to an output of said second TDMA amplifier; and
a duplexer coupled to an output of said saturated amplifier.

20. A power amplifier as recited in claim 19, further comprising:
switching circuitry coupled to an output of said second isolator and an output of said duplexer, for selectively coupling said output of said second TDMA amplifier and said output of said saturated amplifier to a first output line responsive to said amplifier circuit being placed in a TDMA mode or a saturated mode, respectively.

21. A power amplifier circuit for amplifying RF signals, said power amplifier circuit selectively operable in a TDMA mode or a nonlinear mode and selectively operable to amplify RF signals in a first frequency band or a second frequency band, comprising:
a switching network having a high band input and a low band input;
a driver amplifier stage coupled to said switching network; and
a final amplifier stage having a TDMA amplifier and a saturated amplifier;
wherein said low band input is coupled to one of said TDMA amplifier or said saturated amplifier in response to a selection of TDMA mode or analog mode.

* * * * *